(12) United States Patent
Smith

(10) Patent No.: US 6,373,104 B1
(45) Date of Patent: *Apr. 16, 2002

(54) CIRCUIT METHOD FOR REDUCING PARASITIC BIPOLAR EFFECTS DURING ELECTROSTATIC DISCHARGES

(75) Inventor: Jeremy C. Smith, Austin, TX (US)

(73) Assignee: Motorola, Inc., Schaumburg ( * ) Notice: Subject to any disclaimer, the term of this patent is extended or adjusted under 35 U.S.C. 154(b) by 0 days.

This patent is subject to a terminal disclaimer.

(21) Appl. No.: 09/559,354

(22) Filed: Apr. 27, 2000

Related U.S. Application Data

(63) Continuation-in-part of application No. 09/201,392, filed on Nov. 30, 1998, now Pat. No. 6,329,692.

(51) Int. Cl.$^7$ .............................. H01L 29/72
(52) U.S. Cl. ................ 257/355; 257/356; 257/357; 257/358; 257/360; 257/361; 257/363
(58) Field of Search ................ 257/355, 356, 257/357, 358, 360, 361, 363

(56) References Cited

U.S. PATENT DOCUMENTS

| | | | |
|---|---|---|---|
| 5,019,888 A | 5/1991 | Scott et al. | 357/41 |
| 5,021,853 A | 6/1991 | Mistry | 357/23.13 |
| 5,157,573 A | 10/1992 | Lee et al. | 361/56 |
| 5,225,702 A | 7/1993 | Chatterjee | 257/360 |
| 5,440,162 A | 8/1995 | Worley et al. | 257/355 |
| 5,465,189 A | 11/1995 | Polgreen et al. | 361/58 |
| 5,903,419 A | 5/1999 | Smith | 361/56 |

OTHER PUBLICATIONS

"Substrate Triggering and Salicide Effects on ESD Performance and Protection Circuit Design in Deep Submicron CMOS Processes," Amerasekera, et al; IEEE; pp. 547–550 (1995).

"A Substrate Triggered Lateral Bipolar Circuit for High Voltage Tolerant ESD Protection Applications," Smith.

"EOS/ESD Analysis of High–Density Logic Chips," Ramaswamy, et al; EOS/ESD Symposium 96; pp. 6.4.1–6.4.6.

"Analysis of Snubber–Clamped Diode–String Mixed Voltage Interface ESD Protection Network for Advanced Microprocessors," Voldman et al.; EOS/ESD Symposium 95; pp. 43–61.

*Primary Examiner*—Edward Wojciechowicz

(57) ABSTRACT

A semiconductor device include a current source having a first node coupled to a first voltage reference node, and a second node for extracting a current in response to an electrostatic discharge (ESD) on a terminal. The device further includes a transistor having a well and a control electrode, a first current electrode coupled to a second voltage reference node, and a second current electrode coupled to the second node of the current source, and includes a resistive element is coupled to the terminal and the second node of the current source. The transistor of the semiconductor device is biased by detecting a positive voltage event (such as an ESD) at the first current electrode of the transistor, and biasing the first current electrode of the transistor in response to detecting the positive voltage event, wherein the biasing of the first current electrode is for preventing a forward biasing of an n-p junction associated with the transistor.

9 Claims, 4 Drawing Sheets

US 6,373,104 B1

CIRCUIT METHOD FOR REDUCING PARASITIC BIPOLAR EFFECTS DURING ELECTROSTATIC DISCHARGES

RELATED APPLICATION

This is a Continuation-In-Part of U.S. patent application Ser. No. 09/201,392, filed Nov. 30, 1998 now U.S. Pat. No. 6,329,692 issued Dec. 11, 2001 and entitled "Circuit and Method For Reducing Parasitic Bipolar Effects During Electrostatic Discharges" (Smith), and is incorporated herein by reference and assigned to the current assignee hereof.

FIELD OF THE INVENTION

The present invention generally relates to circuits, and more particularly, to a circuit and method for reducing parasitic bipolar effects during electrostatic discharges.

BACKGROUND OF THE INVENTION

An integrated circuit or semiconductor device can be damaged when subjected to a voltage that is higher than the design voltage of the integrated circuit. Electrostatic discharge ("ESD"), originating from such sources as a mechanical chip carrier, a plastic chip storage device, or even a human being can generate a voltage that is many times greater than the design voltage of the integrated circuit. For example, the typical human body can supply an electrostatic discharge in excess of 4 kilovolts. For integrated circuits that operate at voltages of less than, for example, 5 volts, an electrostatic discharge of such proportions can be devastating.

In order to protect the internal circuitry from electrical overstress (EOS), or ESD, events, protection circuits are utilized, generally between the internal circuitry and the input/output ("I/O") pins of the integrated circuit. One mechanism that can cause circuit failures during ESD events is a phenomenon known as "bipolar snapback".

BRIEF DESCRIPTION OF THE DRAWINGS

A better understanding of the present invention can be obtained when the following detailed description of a preferred embodiment is considered in conjunction with the following drawings, in which.

Figure 1:
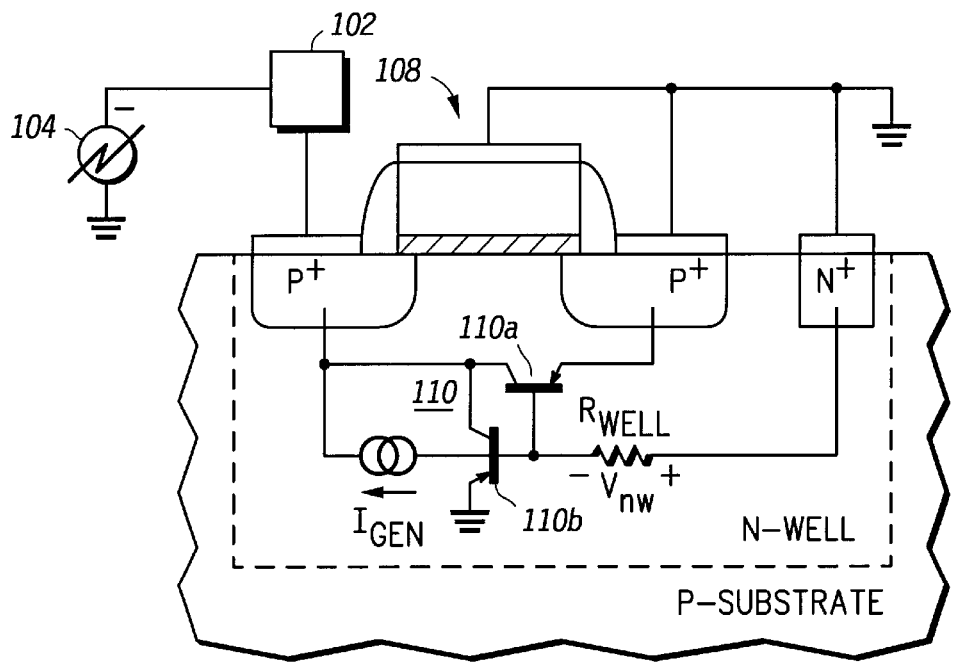
FIG. 1 illustrates, in partial schematic diagram form and partial cross-sectional view, a P-channel MOS transistor and an inherent parasitic bipolar transistor.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION OF A PREFERRED EMBODIMENT

FIG. 1 illustrates, in partial schematic diagram form and partial cross-sectional view, a P-channel metal-oxide semiconductor (MOS) transistor 108 and an inherent parasitic PNP transistor 110, which is composed of a lateral PNP transistor 110a and vertical PNP transistor 110b. As FIG. 1 illustrates, the lateral PNP transistor 110a is formed in the n-well and having an emitter coupled to the source, a collector coupled to the drain, and a base coupled to the n-well of P-channel MOS transistor 108. As FIG. 1 also illustrates, the vertical PNP transistor 110b is formed having an emitter coupled to a source, a collector coupled to the P-substrate and a base coupled to the n-well of P-channel transistor 108. Under bipolar snapback conditions, current flow in the lateral PNP transistor 110a often exceeds that in the vertical PNP transistor 110b. For the purpose of FIG. 1 and related figures, the lateral PNP transistor 110a can most influence the behavior or parasitic bipolar transistor 110. Therefore, reference to the inherent PNP transistor 110 primarily refers to the lateral PNP transistor 110a. However, under other ESD conditions, the vertical PNP transistor 110b can play a significant role in conducting ESD current. In FIG. 1, the n-well tie and the source are illustrated coupled to a Vdd rail which becomes coupled to the ground during an ESD event, with the drain coupled to an I/O pad 102. The I/O pad 102 is shown receiving a negative ESD event.

During bipolar snapback, the parasitic bipolar device formed by a p+ diffusion coupled to the bondpad (collector) and a p+ diffusion coupled to ground (emitter), can conduct large amounts of ESD discharge current by means of a self-biased mechanism through the inherent n-well resistance labeled "Rwell". The self-biasing results from avalanche-breakdown at the collector/base (i.e. p+ pad to n-well) diffusion where avalanche-generated electron-hole pairs are created. The avalanche-generation source is shown schematically as current source $I_{GEN}$ in FIG. 1, which represents n-well (hole) current. The electrons generated from this effect migrate towards the n-well tie through the inherent n-well resistance, thereby producing a local reduction in the n-well potential near the transistor 108. Once this potential falls below roughly negative 0.5V, for example, it is sufficient to forward bias the base-emitter junction (i.e. to n-well to p+) of the parasitic PNP device, thereby turning the device on. The drain-to-source voltage and drain current point at which parasitic bipolar action first occurs is called $(V_{T1}, I_{T1})$, where $I_{T1}$ is the current which is flowing due to the avalanche-generation at the drain/n-well junction. Usually, the bipolar device inherently contained in the P-channel MOS device of, for example, an output buffer is the most susceptible to snapback. This parasitic device is frequently the point of failure in a circuit subjected to an ESD event.

Figure 2:
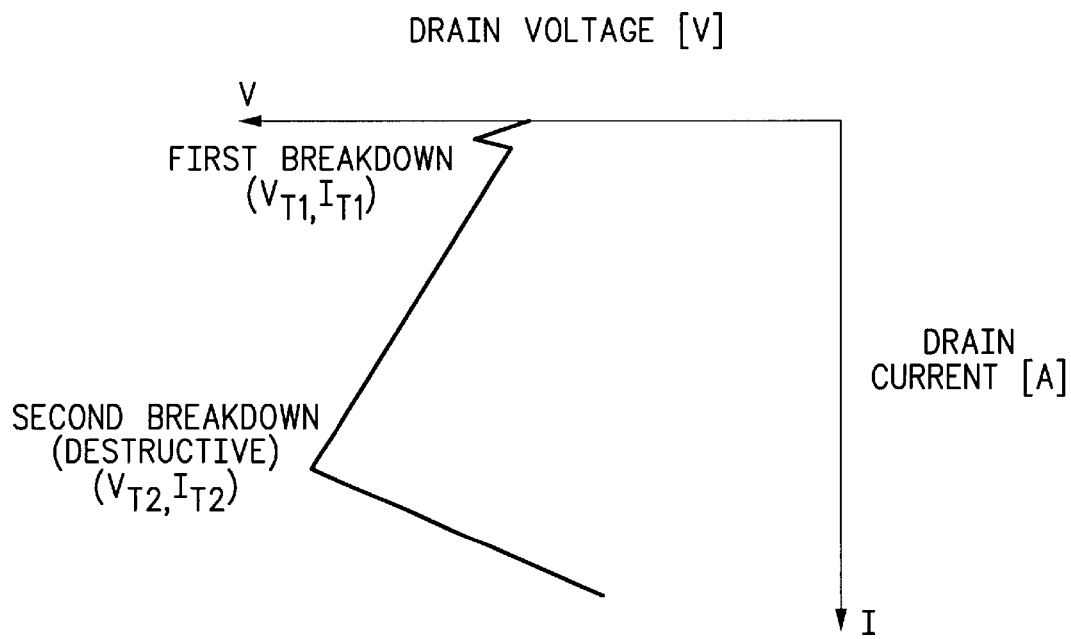
FIG. 2 illustrates a diagram of the snapback drain current versus drain voltage characteristics of the P-channel MOS transistor of FIG. 1 in response to a negative ESD event.

FIG. 2 illustrates a diagram of the snapback drain current versus drain-tosource voltage of the P-channel transistor of FIG. 1 in response to a negative ESD event. When several PMOS transistors (or several fingers forming a single PMOS transistor) act as a parasitic bipolar device, the "snap-back" current-voltage characteristics of the inherent parasitic bipolar transistor is used. As stated above, a current begins to flow through the bipolar transistor at a certain collector-to-emitter voltage, $V_{T1}$. Thereafter the magnitude collector-to-emitter voltage decreases as the magnitude of the current increases, "snapping back" from $V_{T1}$. As the magnitude of the drain voltage increases, the trend reverses, causing the magnitude of the collector-to-emitter voltage to rise as the current also rises. Eventually, the bipolar transistor fails at another particular collector-to-emitter voltage $V_{T2}$. The magnitude $V_{T2}$ is usually greater than the magnitude $V_{T1}$ since on-resistance exhibited by the transistor is quite high. The failure current is the second breakdown current, $I_{T2}$, shown in FIG. 2. The value of $I_{T2}$ must not be exceeded during an ESD event or else permanent damage will result in the device. In general, $I_{T2}$ depends on specific fabrication parameters of a particular technology, and varies from technology to technology.

Figure 3:
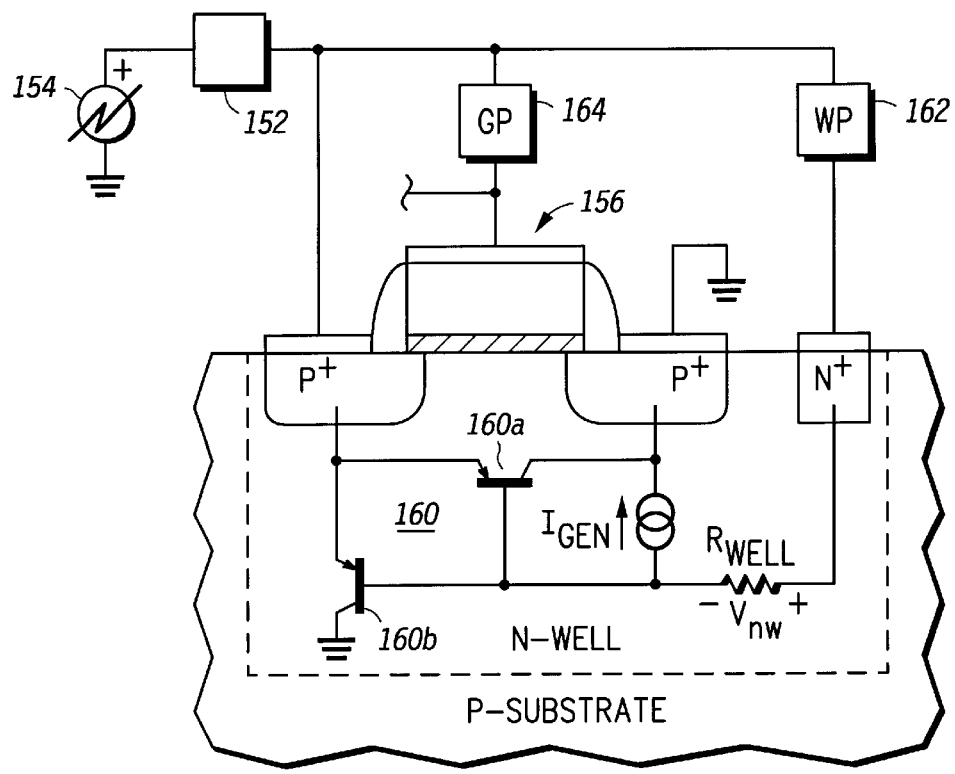
FIG. 3 illustrates, in partial schematic diagram form and partial cross-sectional view, a tracking well P-channel MOS transistor and an inherent parasitic bipolar transistor.

FIG. 3 illustrates, in partial schematic diagram form and partial cross-sectional view, a tracking well P-channel metal-oxide semiconductor (MOS) transistor 156 and an inherent parasitic PNP transistor 160, which is composed of a lateral PNP transistor 160a and a vertical PNP transistor 160b. As FIG. 3 illustrates, the lateral PNP transistor 160a is formed in the n-well and having an emitter coupled to the drain, a collector coupled to the source, and a base coupled to the n-well of P-channel MOS transistor 156. As FIG. 3 also illustrates, the vertical PNP transistor 160b is formed having an emitter coupled to a drain, a collector coupled to the P-substrate and a base coupled to the n-well of P-channel transistor 156. Under bipolar snapback conditions, current flow in the lateral PNP transistor 160a often exceeds that in the vertical PNP transistor 160b. For the purpose of FIG. 3 and related figures, the lateral PNP transistor 160a can most influence the behavior or parasitic bipolar transistor 160. Therefore, reference to the inherent PNP transistor 160 primarily refers to the lateral PNP transistor 160a. However, under other ESD conditions, the vertical PNP transistor 160b can play a significant role in conducting ESD current. In FIG. 3, the source is illustrated coupled to a Vdd rail which becomes coupled to the ground during an ESD event, with the drain coupled to an I/O pad 152. The n-well tie is coupled through a well pump 162 to the I/O pad 152, and the gate is coupled through a gate pump 164 to the I/O pad 152. The I/O pad 152 is shown receiving a positive ESD event.

During bipolar snapback, the parasitic bipolar device formed by a p+ diffusion coupled to the bondpad (emitter) and a p+ diffusion coupled to ground (collector), can conduct large amounts of ESD discharge current by means of a self-biased mechanism through the inherent n-well resistance labeled "Rwell". The self-biasing results from avalanche-breakdown at the collector/base (i.e. grounded p+ to n-well) diffusion where avalanche-generated electron-hole pairs are created. The avalanche-generation source is shown schematically as current source $I_{GEN}$ in FIG. 3, which represents n-well (hole) current. The electrons generated from this effect migrate towards the n-well tie (which is elevated to the pad potential by well pump 162) through the inherent n-well resistance, thereby producing a local reduction in the n-well potential near the transistor 156. Once this potential falls roughly 0.5V below the pad voltage, for example, it is sufficient to forward bias the base-emitter junction (i.e. n-well to p+ pad) of the parasitic device, thereby turning the device on. The drain-to-source voltage and drain current point at which parasitic bipolar action first occurs is called ($V_{T1}$, $I_{T1}$), where $I_{T1}$ is the current which is flowing due to the avalanche-generation at the source/n-well junction. Usually, the bipolar device inherently contained in the P-channel MOS device of, for example, an output buffer is the most susceptible to snapback. This parasitic device is frequently the point of failure in a circuit subjected to an ESD event.

Figure 4:
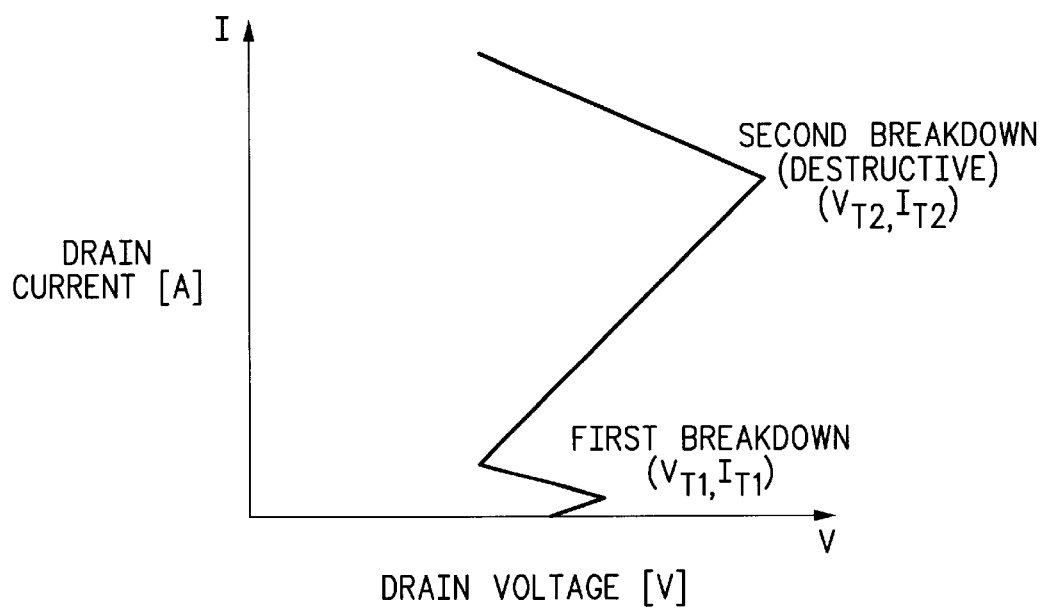
FIG. 4 illustrates a diagram of the snapback drain current versus drain voltage characteristics of the tracking well P-channel MOS transistor of FIG. 3 in response to a positive ESD event.

FIG. 4 illustrates a diagram of the snapback drain current versus drain-tosource voltage of the tracking well P-channel transistor of FIG. 3 in response to a positive ESD event. When several PMOS transistors (or several fingers forming a single PMOS transistor) act as a parasitic bipolar device, the "snapback" current-voltage characteristics of the inherent parasitic bipolar transistor is used, as stated above, and a current begins to flow through the bipolar transistor at a certain collector-to-emitter voltage, $V_{T1}$. Thereafter the collector-to-emitter voltage decreases as the current increases, "snapping back" from $V_{T1}$. As drain voltage increases, the trend reverses, causing the collector-to-emitter voltage to rise as the current also rises. Eventually, the bipolar transistor fails at another particular collector-to-emitter voltage $V_{T2}$. $V_{T2}$ is usually greater than $V_{T1}$ since on-resistance exhibited by the transistor is quite high. The failure current is the second breakdown current, $I_{T2}$, shown in FIG. 4. The value of $I_{T2}$ must not be exceeded during an ESD event or else permanent damage will result in the device. In general, $I_{T2}$ depends on specific fabrication parameters of a particular technology, and varies from technology to technology.

In one embodiment, the method and circuit of the present invention lowers the voltage of the source and in another embodiment, lowers the voltage of the drain of the P-channel transistor in order to keep the base-emitter voltage of the parasitic bipolar device low enough to prevent conduction in the parasitic bipolar device. The present invention prevents bipolar snapback in advanced semiconductor technologies where an almost instantaneous destruction of the device occurs once $V_{T1}$ has been exceeded (i.e., $V_{T2}=V_{T1}$ and $I_{T2}=I_{T1}$). For these devices, it is not sufficient to ameliorate the effects of bipolar snapback once it has occurred, since a very low value of failure current, $I_{T2}$, is exhibited. Rather, it is desirable to avoid snapback altogether and care must be taken to increase the magnitude of $V_{T1}$ so that the output buffer PMOS device does not snapback during an ESD discharge.

Figure 5:
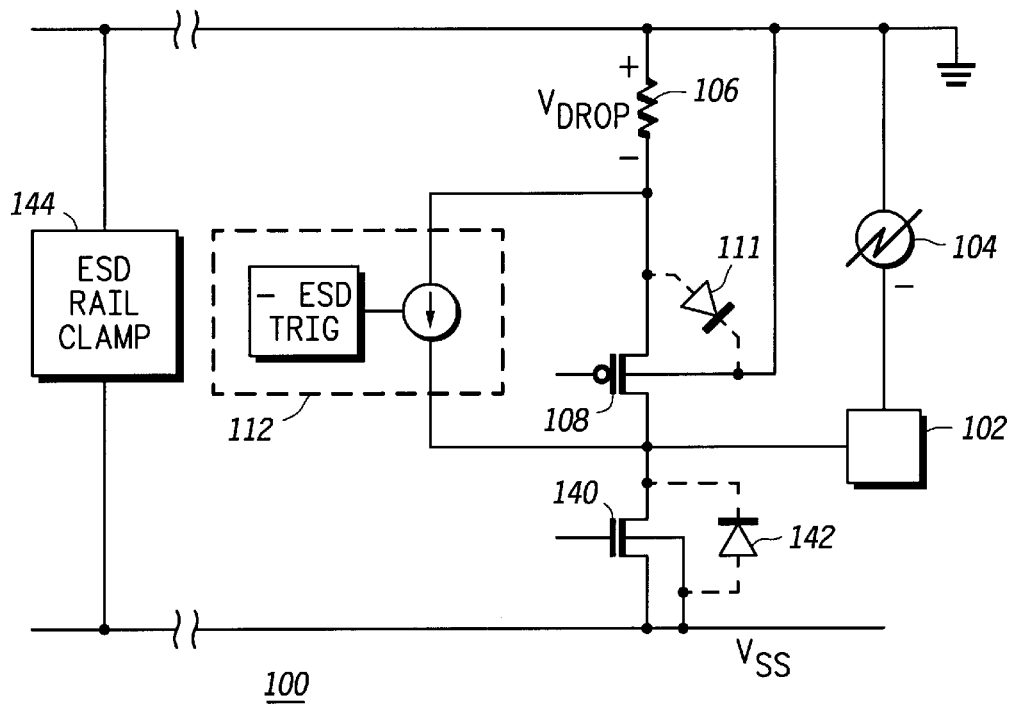
FIG. 5 illustrates in partial block diagram, partial schematic diagram form, an output buffer circuit 100 during an ESD event in accordance with the present invention.

FIG. 5 illustrates in partial block diagram, partial schematic diagram form, an output buffer circuit 100 during an ESD event in accordance with the present invention. Circuit 100 is illustrated having ESD protection during a negative ESD event 104, and includes the P-channel transistor 108 and an inherent diode 111 as illustrated in FIG. 1, a resistive element such as resistor 106 coupled to the source of the transistor 108, a pad 102 or terminal coupled to the drain of the transistor 108, and a source injection current source 112 which will be described further in reference to FIG. 6. FIG. 5 also includes an output buffer N-channel transistor 140 with an inherent diode 142 and ESD rail clamp 144. P-channel transistor 108 is illustrated with the inherent diode 111 coupled between the source of the transistor 108 and well. The current source 112 has a first node coupled to the terminal or pad 102, and a second node for extracting a current in response to the ESD event 104 on the pad 102. The resistor 106 includes a first node coupled to a voltage reference node, which, during normal operation of the output buffer circuit 100, is Vdd, and which becomes grounded during the negative ESD event 104. The resistor 106 also includes a second node coupled to the second node of the current source 112. The transistor 108 includes a control electrode, a first current electrode coupled to the pad 102, and a second current electrode coupled to the second node of the current source 112. A negative voltage event such as the negative ESD event 104 is detected at the first current electrode of the transistor 108 coupled to the pad 102. The second current electrode of the transistor 108, coupled to the current source 112, is biased in response to detecting the negative ESD event 104 to prevent a forward biasing of the inherent diode 111, or p-n junction, associated with the transistor 108.

Figure 6:
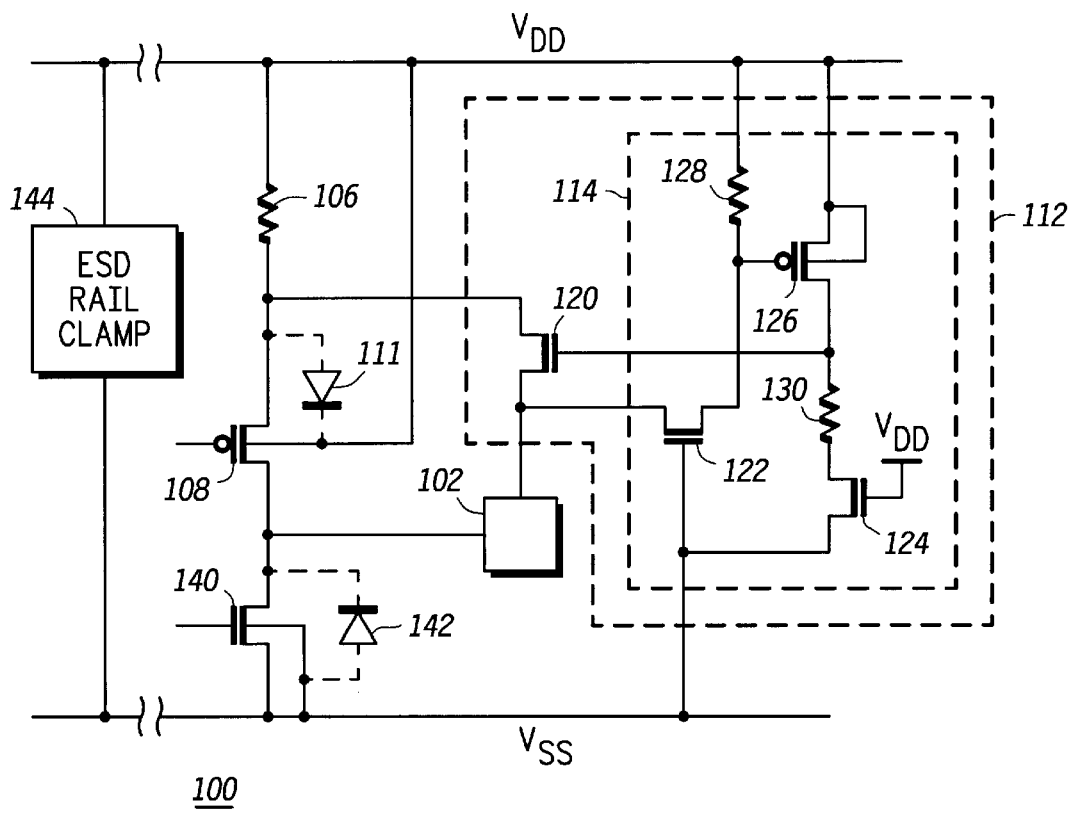
FIG. 6 illustrates, in schematic diagram form, the output buffer circuit 100 of FIG. 5.

FIG. 6 illustrates, in schematic diagram form, the output buffer circuit 100 of FIG. 5 and illustrates in further detail an embodiment of the source injection current source 112 which is further comprised of a source injection bias circuit 114 and a source injector transistor 120. N-channel source injector transistor 120 has a source coupled to the pad 102, a gate, and a drain coupled to one terminal of the resistor 106. The gate of the N-channel source injector transistor 120 is biased by a source injection bias circuit 114 including a feedback circuit having an N-channel transistor 122, a P-channel transistor 126, and a resistor 128, and including a pull-down circuit having an N-channel transistor 124 and a resistor 130. N-channel transistor 122 has a gate coupled to a ground terminal labeled Vss, a source coupled to pad 102, and a drain. Resistor 128 has a first terminal coupled to the gate of P-channel transistor 126, and a second terminal coupled to a positive power supply voltage terminal labeled Vdd. N-channel transistor 124 has a gate coupled to Vdd, a source coupled to Vss, and a drain. Resistor 130 has a first terminal coupled to the drain of N-channel transistor 124, and a second terminal. P-channel transistor 126 has a drain coupled to the second terminal of resistor 130, a gate coupled to the drain of N-channel transistor 122, and a source coupled to Vdd.

During normal operation of the output buffer circuit, the gate of transistor 108 is biased by internal circuitry which causes transistor 108 to conduct as necessary to drive pad 102 to the required voltage. Furthermore, the gate of source injector transistor 120 is held at Vss by the pull-down circuit consisting of transistor 124 and resistor 130, which prevents transistor 120 from conducting. Similarly, the gate of transistor 126 is held at Vdd in normal operation by resistor 128, which prevents transistor 126 from conducting. Transistor 122 is held in a non-conducting state during normal operation since the gate of the transistor 122 is coupled to Vss.

During a negative ESD event or other EOS event, source injector bias circuit 114 maintains source injector transistor 120 in a conductive state. N-channel source injector transistor 120 then functions as a current source. N-channel transistor 120 becomes conductive when the voltage at pad 102 falls one threshold drop below the Vss causing a reduced potential to appear at the gate of P-channel transistor 126. P-channel transistor 126 then becomes conductive which causes the gate of source injector transistor 120 to be coupled to Vdd which causes the N-channel source injector transistor 120 to become strongly conductive, since Vdd is the highest potential during the negative ESD event. Some of the ESD current is then conducted from Vdd, through resistor 106 to pad 102 through N-channel source injector transistor 120. The rest of the ESD current flows from Vdd through an ESD rail clamp 144, to Vss and back to pad 102 through an inherent drain diode 142 of an output N-channel transistor 140.

By causing some of the ESD current to flow through resistor 106 and source injector transistor 120, the voltage at the source or transistor 108 will be reduced, thus lowering the emitter potential of the inherent PNP transistor 110 (as illustrated in FIG. 1) preventing the inherent PNP transistor 110 from becoming conductive. This increases the magnitude of the negative voltage that can build up during an ESD event beyond that at which snapback would normally occur, which as discussed above, is particularly destructive to integrated circuits constructed using advanced, salicided technology.

The upper limit on the resistance of resistor 106 is determined by the length of the turn-on delay caused by resistor 106 to P-channel transistor 108. Only a small voltage reduction on the source P-channel transistor 108 is needed to prevent conduction of the parasitic bipolar device because the well potential of transistor 108 cannot fall too far since the well is coupled to Vdd. If the source of P-channel transistor 108 is at least a diode drop below the well potential, bipolar snapback is prevented from occurring. In the illustrated embodiment, resistor 106 is implemented as having a resistance value of about 10 ohms or less.

In an alternate embodiment, instead of using source injection bias circuit 114, the gate of N-channel source injector transistor 120 may be connected directly to Vss. However, an advantage to using source injection bias circuit 114 is that if Vss begins to move sympathetically with pad 102, a gate-to-source voltage sufficient to keep n-channel source injector transistor 120 conductive is maintained because only a very small current in resistor 128 is enough to cause the voltage drop across resistor 128 to exceed the threshold voltage of P-channel transistor 126. P-channel transistor 126 stays conductive, insuring that the gate voltage of source injector transistor 120 is high enough to cause source injector transistor 120 to remain highly conductive.

The use of resistor 106 with current source 112 formed by source injector transistor 120 and source injector bias circuit 114 can greatly extend the ESD range of the buffer circuit before breakdown occurs, which gives the ESD protection circuit more margin before failure of the device.

Figure 7:
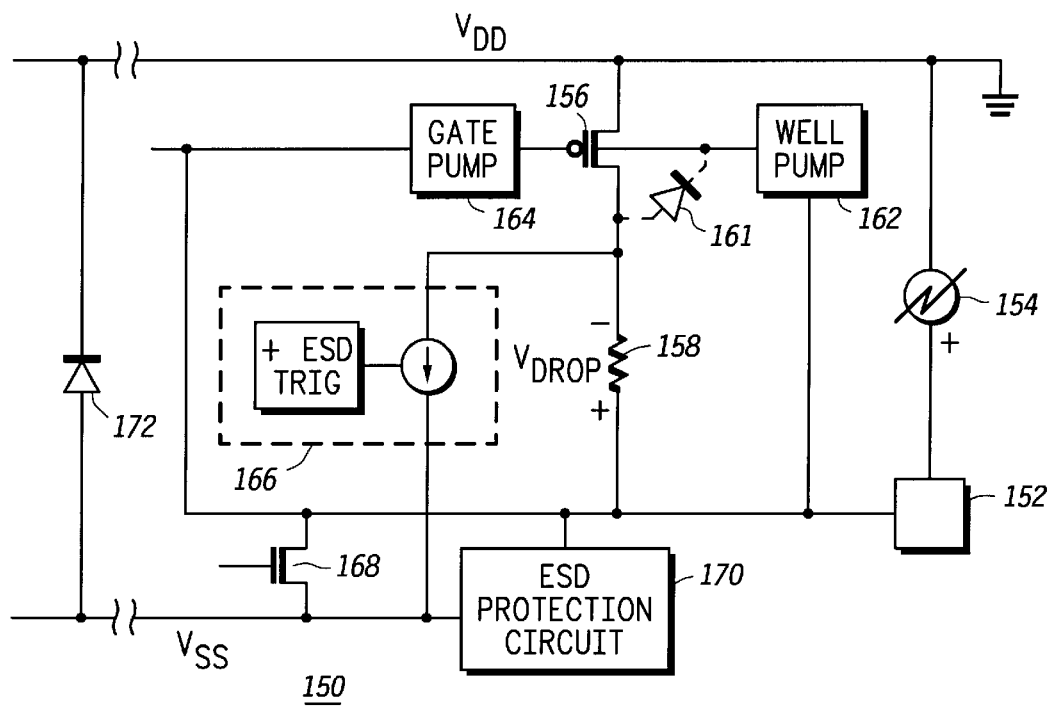
FIG. 7 illustrates in partial block diagram, partial schematic diagram form, an input/output (I/O) buffer circuit 150 during an ESD event in accordance with the present invention.

FIG. 7 illustrates in partial block diagram, partial schematic diagram form, an input/output buffer circuit 150 during an ESD event in accordance with the present invention. Circuit 150 is illustrated having ESD protection during a positive ESD event 154, and includes a P-channel tracking well transistor 156 with an inherent diode 161, a gate pump circuit 164 and well pump circuit 162 as illustrated in FIG. 3, and an ESD protection circuit 170. A resistive element such as a resistor 158 is coupled to the drain of P-channel tracking well transistor 156. Circuit 150 further includes an N-channel buffer transistor 168 and an ESD current source 166 which will be described further in reference to FIG. 8. Tracking well P-channel transistor 156 is illustrated with the inherent diode 161 coupled between the drain of the transistor 156 and the well. The ESD current source 166 has a first node coupled to Vss and a second node coupled to the drain node of tracking well transistor 156 for extracting current from this node during a positive ESD event 154. Resistor 158 includes a first node coupled to pad 152 and a second node coupled to the second node of the ESD current source and the drain of tracking well P-channel transistor 156.

In normal operation input/output buffer circuit 150 either transmits internal signals to pad 152 (output buffer) or receives external signals from pad 152 (input buffer, not shown in FIG. 7). Tracking well P-channel transistor 156 and N-channel buffer transistor 168 must remain in a non-conductive state when input/output buffer circuit 150 is used as an input buffer. Internal circuitry (not shown) is used to supply a high level signal (i.e. near Vdd) to the gate of tracking well P-channel transistor 156 and a low level signal (i.e. near Vss) to the gate of N-channel buffer transistor 168 when input/output buffer circuit 150 is used as in input buffer. Furthermore, it is a common requirement that, when input/output buffer circuit 150 is used as an input buffer, the circuit 150 have the ability to receive external signals which exceed the chip Vdd potential (HV-signal), which is known as high voltage tolerance. For example, a chip operating with a supply voltage of 2.5V may need to be able to receive input signals from other chips operating at 3.3V when both are placed in the same system. Tracking well P-channel transistor 156 includes a control electrode which is coupled to gate pump circuit 164 and a well electrode which is coupled to well pump circuit 162. Tracking well P-Channel transistor 156 is coupled to gate pump 164 and well pump 162 so that when the HV-signal is received by pad 152, the gate and well of tracking well P-channel transistor 156 can be elevated to the potential of pad 152. The well potential of tracking well P-Channel transistor 156 is elevated to that of pad 152, such that the inherent drain-to-well diode 161 of the transistor 156 does not forward bias in this situation. The gate potential of the tracking well P-channel transistor 156 is elevated to that of pad 152 such that the tracking well P-channel transistor 156 remains non-conductive since the transistor 156 would begin to conduct if the gate potential were a threshold drop below that of the (former) drain, which, in this situation, electrically acts as a new source.

During a positive ESD event 154, a positive potential is detected on pad 152 which then causes current source 166 to extract some of the ESD current from the drain node of tracking well P-channel transistor 156 which in turn causes a potential drop across resistor 158. The potential at the anode of inherent diode 161 is lowered. The well pump circuit 162 elevates the well of tracking well P-channel transistor 156 to a potential near that of the pad 152. However, there is a finite time delay for this elevation to occur during which the well potential of tracking well P-channel transistor 156 may lag that of pad 152, which would cause inherent diode 161 to forward bias thereby turning on the inherent PNP transistor 160 illustrated in FIG. 3. Furthermore, under fast, extreme-potential ESD events, the well pump circuit 162 has a limited ability to drive the well of tracking well P-channel transistor 156, which further allows the well to lag the pad 152 potential thereby turning on the inherent PNP transistor 160 illustrated in FIG. 3. By lowering the potential at the anode of the inherent diode 161, the inherent diode 161 is prevented from forward biasing which prevents the inherent PNP transistor 161 in FIG. 3 from conducting. To prevent parasitic bipolar conduction, the drain of tracking well P-channel transistor 156 is at least one diode drop below the potential of the well of the transistor 156. By extracting some of the ESD current during a positive event through resistor 158, this reduction in potential can be achieved. The rest of the ESD current is conducted by ESD protection circuit 170 and ESD rail diode 172.

The upper limit on the resistance of resistor 158 is determined by the length of the turn-on delay caused by resistor 158 to tracking well P-channel transistor 156. Only a small voltage reduction on the drain of P-channel transistor 156 is needed to prevent conduction of the parasitic PNP device because the well potential of transistor 156 is elevated near the pad voltage by well pump 162. If the drain of P-channel transistor 156 is at least a diode drop below the well potential of transistor 156, bipolar snapback is prevented from occurring. In the illustrated embodiment, resistor 158 is implemented as having a resistance value of about 10 ohms or less.

Figure 8:
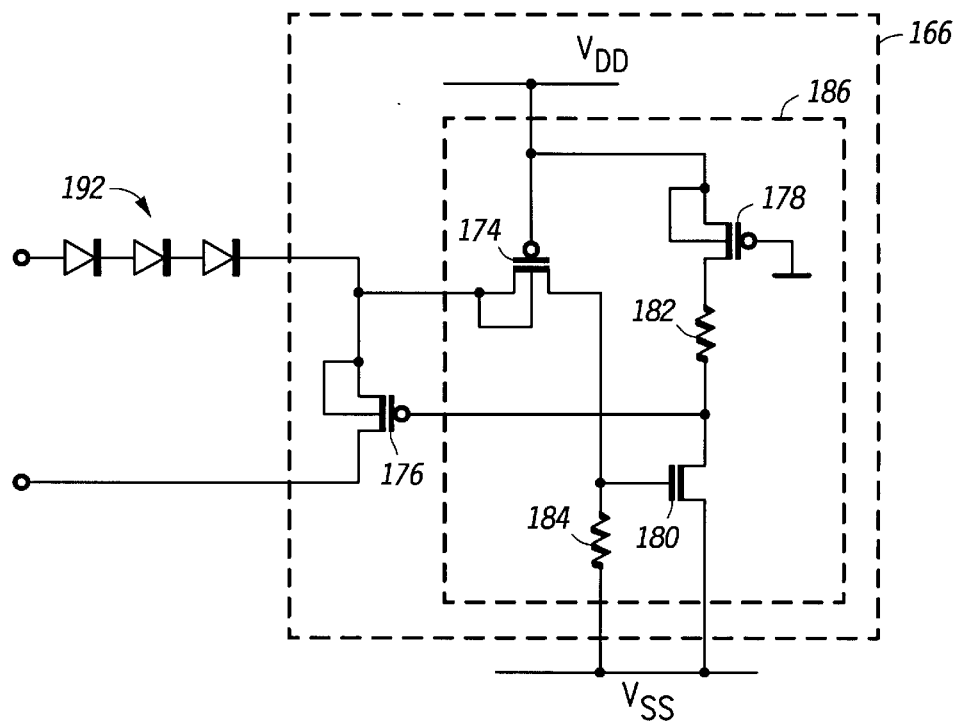
FIG. 8 illustrates, in schematic diagram form, the ESD current source 166 of the I/O buffer circuit illustrated in FIG. 7.

FIG. 8 illustrates one embodiment of ESD current source circuit 166. A diode string 192 is coupled to the drain terminal of ESD current source transistor 176 and P-channel transistor 174 to prevent the circuit 166 from responding to high voltage input signals in normal operation (i.e. high voltage tolerance). During normal operation, a pull-up circuit, consisting of P-channel transistor 178 and resistor 182 contained in current source bias circuit 186, maintains transistor 176 in a non-conductive state by holding the gate of transistor 176 near Vdd. The transistor 176 must not conduct when HV signals are applied to the pad 152. For example, the chip could operate at 2.5V and need to receive 3.3V input signals from external devices. If the diode string 192 were not present and the drain terminal of the transistor 176 directly coupled to pad 152, transistor 176 would begin to conduct when the pad potential was greater that one threshold drop above Vdd, or approximately 0.5V+2.5V=3V, for example. However, when diode string 192 is present, a pad voltage of $3(V_d)+|V_{tp}|+Vdd$, or approximately 3(0.5V)+0.5V+2.5V or 4.5V can safely be applied without causing current source transistor 176 to conduct. In general, the length of diode string 192 can be adjusted to accommodate any given input potential During a positive ESD or EOS event, the P-channel transistor 176 functions as a current source. A feedback network consisting of P-channel transistor 174, N-channel transistor 180 and resistor 184 contained in circuit 186, maintains transistor 176 in a conductive state. The P-channel transistor 176 and the P-channel transistor 174 become conductive when the voltage at pad 152 exceeds one threshold voltage drop above Vdd, which is at ground potential during ESD event 154. Current flow in P-channel transistor 174 flows through resistor 184 which causes a relatively high voltage to be supplied to the gate of N-channel transistor 180. N-channel transistor 180 then becomes conductive causing the gate of P-channel transistor 176 to be pulled low, and causing current source P-channel transistor 176 to become strongly conductive. Some of the ESD current is conducted from pad 152, through resistor 158 and P-channel current transistor 176 to Vss. The rest of the ESD event current flows through the ESD protection circuit 170 and the ESD rail diode 172.

While the invention has been described in the context of a preferred embodiment, it will be apparent to those skilled in the art that the present invention may be modified in numerous ways and may assume many embodiments other than that specifically set out and described above. For instance, the disclosed invention is described with respect to a particular set of transistor conductivity types. One skilled in the art, with the above description may change conductivity types under certain circumstances to tailor the invention to a particular process or embodiment. One skilled in the art may substitute other structures to accomplish the same purpose. Accordingly, it is intended by the appended claims to cover all modifications of the invention which fall within the true scope of the invention.

What is claimed is:

1. A semiconductor device comprising:
   a terminal;
   a current source having a first node coupled to a first voltage reference node, and a second node for extracting a current in response to an electrostatic discharge (ESD) on the terminal;

a first resistive element having a first node coupled to the terminal and a second node coupled to the second node of the current source; and a first transistor having a well, a control electrode, a first current electrode coupled to a second voltage reference node, and a second current electrode coupled to the second node of the current source.

2. The semiconductor device of claim 1, wherein the first transistor is a P-channel transistor.

3. The semiconductor device of claim 2, further comprising:

a gate pump having a first node coupled to the terminal and a second node coupled to the control electrode of the first transistor; and a well pump having a first node coupled to the well of the first transistor and a second node coupled to the terminal.

4. The semiconductor device of claim 2, wherein the first current electrode of the first transistor is a source electrode, and the second current electrode is a drain electrode.

5. The semiconductor device of claim 1, wherein the current source further comprises a second transistor having a control gate, a first current electrode coupled to the first node of the current source, and a second current electrode coupled to the second node of the current source.

6. The semiconductor device of claim 5, wherein the control gate of the second transistor is coupled to the second voltage reference node.

7. The semiconductor device of claim 5, wherein the second transistor is a P-channel transistor.

8. The semiconductor device of claim 5, wherein the current source further comprises a feedback circuit including a third transistor having a control electrode coupled to the second node of the current source, a first current electrode coupled to the first voltage reference node, and a second current electrode coupled to the control electrode of the second transistor.

9. The semiconductor device of claim 8, further comprising:

a fourth transistor having a control electrode, a first current electrode coupled to the second node of the current source, and a second current electrode coupled to the control electrode of the third transistor; and a second resistive element having a first node coupled to the control electrode of the third transistor, and a second node coupled to the first voltage reference node.

* * * * *